United States Patent
Atcitty et al.

(10) Patent No.: US 7,567,060 B1
(45) Date of Patent: Jul. 28, 2009

(54) SYSTEM AND METHOD FOR ADVANCED POWER MANAGEMENT

(75) Inventors: Stanley Atcitty, Albuquerque, NM (US); Philip C. Symons, Surprise, AZ (US); Paul C. Butler, Albuquerque, NM (US); Garth P. Corey, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 545 days.

(21) Appl. No.: 11/172,462

(22) Filed: Jun. 30, 2005

(51) Int. Cl.
    *H02J 7/00* (2006.01)
(52) U.S. Cl. .................. 320/116; 320/132; 307/64; 307/65; 307/66
(58) Field of Classification Search ............... 320/116, 320/132; 307/64–66
    See application file for complete search history.

(56) References Cited

U.S. PATENT DOCUMENTS

| | | | |
|---|---|---|---|
| 5,886,503 A * | 3/1999 | McAndrews et al. | 320/121 |
| 6,084,382 A * | 7/2000 | Hite | 320/116 |
| 6,353,304 B1 | 3/2002 | Atcitty et al. | |
| 6,700,351 B2 | 3/2004 | Blair et al. | |
| 6,720,674 B1 | 4/2004 | Gabrys | |
| 6,812,587 B2 | 11/2004 | Gilbreth et al. | |
| 6,847,192 B2 | 1/2005 | Turner et al. | |
| 6,854,065 B2 | 2/2005 | Smith et al. | |
| 6,859,882 B2 | 2/2005 | Fung | |

* cited by examiner

*Primary Examiner*—Akm E Ullah
*Assistant Examiner*—Yalkew Fantu
(74) *Attorney, Agent, or Firm*—Elmer A. Klavetter

(57) ABSTRACT

A power management system is provided that includes a power supply means comprising a plurality of power supply strings, a testing means operably connected to said plurality of power supply strings for evaluating performance characteristics of said plurality of power supply strings, and a control means for monitoring power requirements and comprising a switching means for controlling switching of said plurality of power supply strings to said testing means.

13 Claims, 3 Drawing Sheets

SYSTEM AND METHOD FOR ADVANCED POWER MANAGEMENT

STATEMENT OF GOVERNMENT INTEREST

The United States Government has rights in this invention pursuant to Department of Energy Contract No. DE-AC04-94AL85000 with Sandia Corporation.

BACKGROUND OF THE INVENTION

The present invention is related to managing power supply systems and, more particularly, to a standby power supply system that ensures continuously-available standby power.

Many industries and applications have a critical need to assure that power sources will be able to supply critical loads in the event of a power failure. Such industries include, but are not limited to, telecommunications, power utilities, information technologies (for example, in banking, stock brokerage, and insurance applications) industries, and critical care medical facilities. Countless examples exist of power sources failing to operate as needed when required. These examples include events resulting in millions of dollars of losses, and events creating public hazards (including air traffic control system failures).

A standby power supply is generally a requirement of the power systems for these applications. A standby power supply can alternately be called an uninterruptible power supply (UPS) or a back-up power supply, or other descriptors, having slightly different designs but each being used to provide a continuous supply of electricity to critical equipment in the event of an electric utility outage. Such standby power supply systems generally include power conversion equipment, batteries, and controls to enable appropriate discharging and recharging of the batteries. Standby power systems are put into use only rarely, as utility outages are themselves rare. Because accurate testing of the standby power supplies is generally performed manually at discrete intervals, it is expensive and time consuming. Such testing is therefore not done frequently and there are sometimes problems with the standby power system failing to perform when required. Additionally, during the time period during which the testing is performed, the standby system is not available in the event of a power failure.

A standby power system is required that can reliably provide sufficient power for a critical load in the event of a power failure but that does not require frequent and expensive manual testing to ensure the reliability of the standby power.

DETAILED DESCRIPTION OF THE INVENTION

The present invention can be implemented in simple, inexpensive, and robust systems and methods to assure assuring that power sources will operate as expected when necessary to supply critical loads in the event of a power failure.

Figure 1:
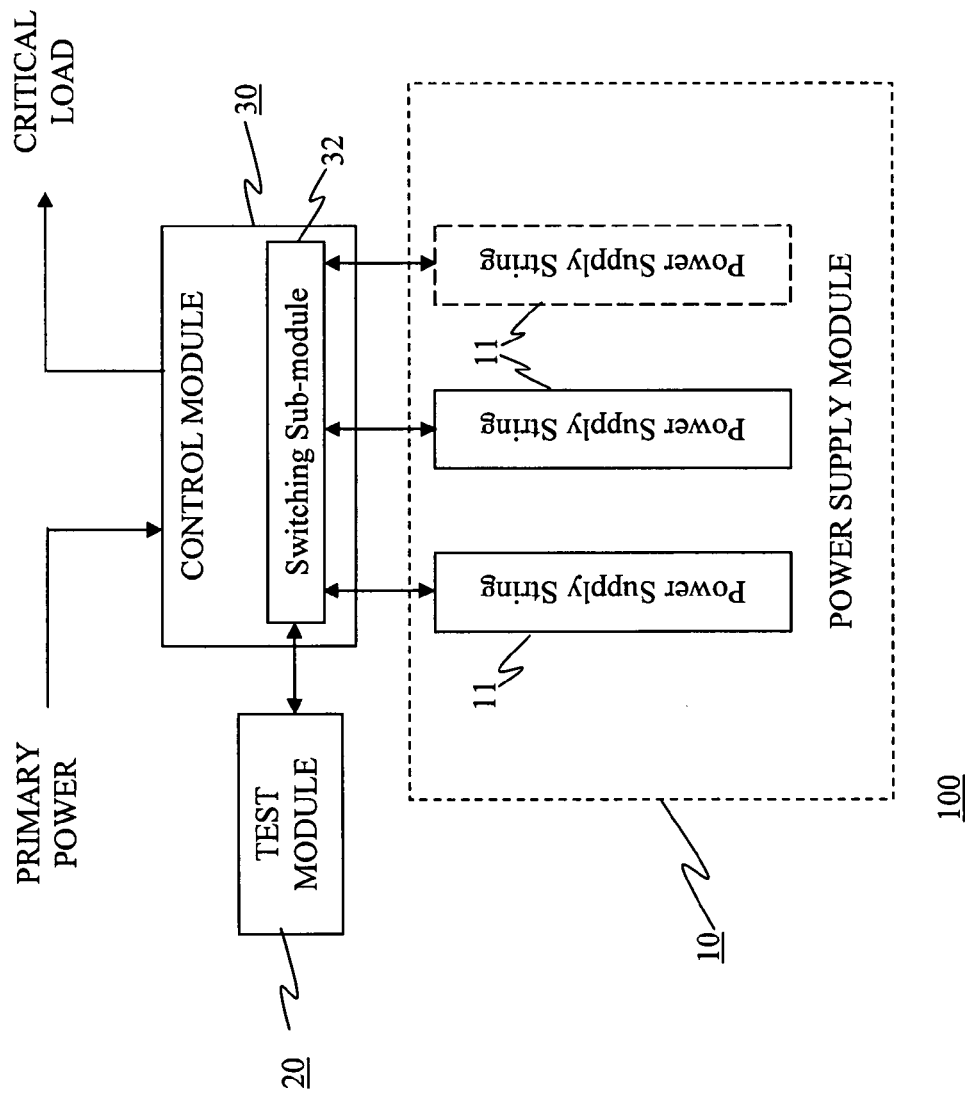
FIG. 1 is a block diagram of an exemplary advanced battery management system according to the present invention.

In a power management system 100 according to the present invention, plural strings of power supplies 11, such as batteries, comprise a power supply module, or power supply means, 10 that is operably connected to a control module, or control means, 30, as illustrated in FIG. 1. The control module comprises both hardware and software and is operatively arranged to switch through a switching sub-module 32 one of the plural power supply strings into a test mode in conjunction with the testing module 20, while keeping the remainder of the plural power supply strings in ready-to-be-used mode so that standby power can be transmitted to critical loads as required in the event of a failure of the primary power supply. At least two power supply strings are required, but the actual number of power supply strings used will depend on the type of power supply used, the power requirements of the system and design and cost requirements. The control module also functions to supply standby power from the power supply module to the load in the event of a detected power failure, determining which strings of power supplies can reliably provide the standby power. The control module not only provides for switching the power supply strings into a test mode, but provides hardware and software for measuring and then recording the performance characteristics of the tested power supply strings, evaluating as desired the performance trend of the string and, as specified, issue instructions for manual maintenance or repair of a particular string or power supply element making up the string. The testing module functions to test each of the plural strings of power supplies according to a predetermined schedule or algorithm, where the testing can be testing of the entire power supply string or any subset of the power supply elements that make up the string. The testing can comprise a variety of tests including a test discharge, which is a short discharge of a battery string or subset of elements to detect possible increases in resistance or a trend analysis test where voltage, current, temperature and other parameters can be monitored as a function of time so that the string performance or degradation can be evaluated. The testing module, or any of its functions, can alternatively be considered to be subsumed within the control module.

The power supply strings are comprised of power supply elements that function to generate or release electrical power, either alternating current (AC) or direct current (DC). For example, each power supply string can be a series of batteries, fuel cells, solar cells, wind-charging elements, capacitors, flywheels and other standard power supply elements. The power supply strings should be assembled such that, when one power supply string is being tested, the remaining power supply strings can supply sufficient power to satisfy the critical load requirements in the event of a primary power failure. That is, if there are N power supply strings, with N greater than or equal to 2, then N−1 power supply strings can supply power sufficient to meet critical load requirements.

The test module, or testing means, 20 comprises necessary hardware and software to test performance characteristics of an individual power supply string or subset elements thereof. The performance characteristics are those parameters derived from tests performed by the testing module that provide information on the current and future capabilities of the power supply strings or elements thereof to provide standby power in the case of a primary power failure. The tests that can be performed by the test module include, but are not limited to, test discharge tests and capacity tests.

The testing module therefore comprises means for performing the discharge test and the capacity test. In the general discharge test, a power supply string or subset thereof is discharged by an integral load at an appropriate rate and to a defined depth of discharge to validate the string's (or string subset's) state of readiness to perform its intended function. The string can then be fully recharged and conditioned as necessary before being switched back into the backup power supply circuit. Test discharge tests measure impedance values by putting on a test load to determine if impedance values have increased, thereby indicating a degradation in performance. These tests require some means for putting a test load on the power supply strings or subset of elements thereof and measuring impedance values. The capacity tests generally discharge the power supply strings or subset thereof and monitor current over time to compare with pre-determined values, requiring means for discharging the power supply elements and means for monitoring current over time. Importantly, the tests are performed while the system is still on-line and capable of supplying back-up power in case of a power failure of the main power system. One power supply string can be tested or any subset of elements in the power supply string can be tested. For example, if the power supply string consists of a series of battery or fuel cell elements, one or more of elements can be tested, as pre-determined in the control module 30. In one embodiment, if the stand-by power supply system is called upon to discharge while one of the strings is in the test mode, then that string can be automatically be brought back into service at an appropriate time during the test cycle. The testing means can be operably connected to the control means so that the control module can control the testing algorithm and so that information from the tests performed within the testing means can be transmitted to the control means.

Another test of performance characteristics can be referred to as trend analysis which uses established algorithms in conjunction with measured data on current, voltage, resistance or other measured electrical characteristics, to predict the performance of a power supply string or element thereof. This analysis can be used to predict time to failure or significant performance degradation even though significant performance degradation has not yet occurred. Therefore, preventative maintenance can be recommended if necessary.

The control module 30 comprises necessary hardware and software to perform a variety of functions. These functions are integrated as required with the testing and power supply modules. One function performed by the control module is to control periodic switching of power supply strings on an individual basis to the testing module to be tested. The device of the present invention therefore provides for automatic testing of the power supply strings and elements thereof so that human intervention need only occur when the device detects a failure in the standby power device or a potential failure. The control module can control testing, whether discharge, capacity, performance trend analysis or other. Alternatively, this function can be thought to be contained within the testing module. The control module can also control monitoring of electrical performance characteristics, such as current, voltage, resistance, and temperature. These monitoring activities provide the data necessary for the device to determine failures or potential failures. The control module also controls monitoring of primary power supply to detect power failure as well as controlling subsequent switching of the standby power to the critical load as needed. As pre-determined from design requirements, the module will control float charging of power supply strings using a pre-determined or pre-programmed algorithm, including the inclusion of a power source to perform the float charging, that is, continuous or semi-continuous charging any or all of the power supply strings or elements in the strings to maintain the performance capabilities of the strings or elements.

One of the important features of the device of the present invention comprises the capability to measure and evaluate the performance characteristics of the power supply strings, whether the power supply strings are in the ready-to-be-used mode or in the testing mode. This capability is provided by standard hardware and software means necessary to monitor characteristics that can include voltage, current, resistance and temperature of one or more of the power supply strings or elements thereof. The necessary hardware and software to accomplish this measurement and evaluation of the desired performance characteristics can be included either in the control module or the test module or both.

Figure 2:
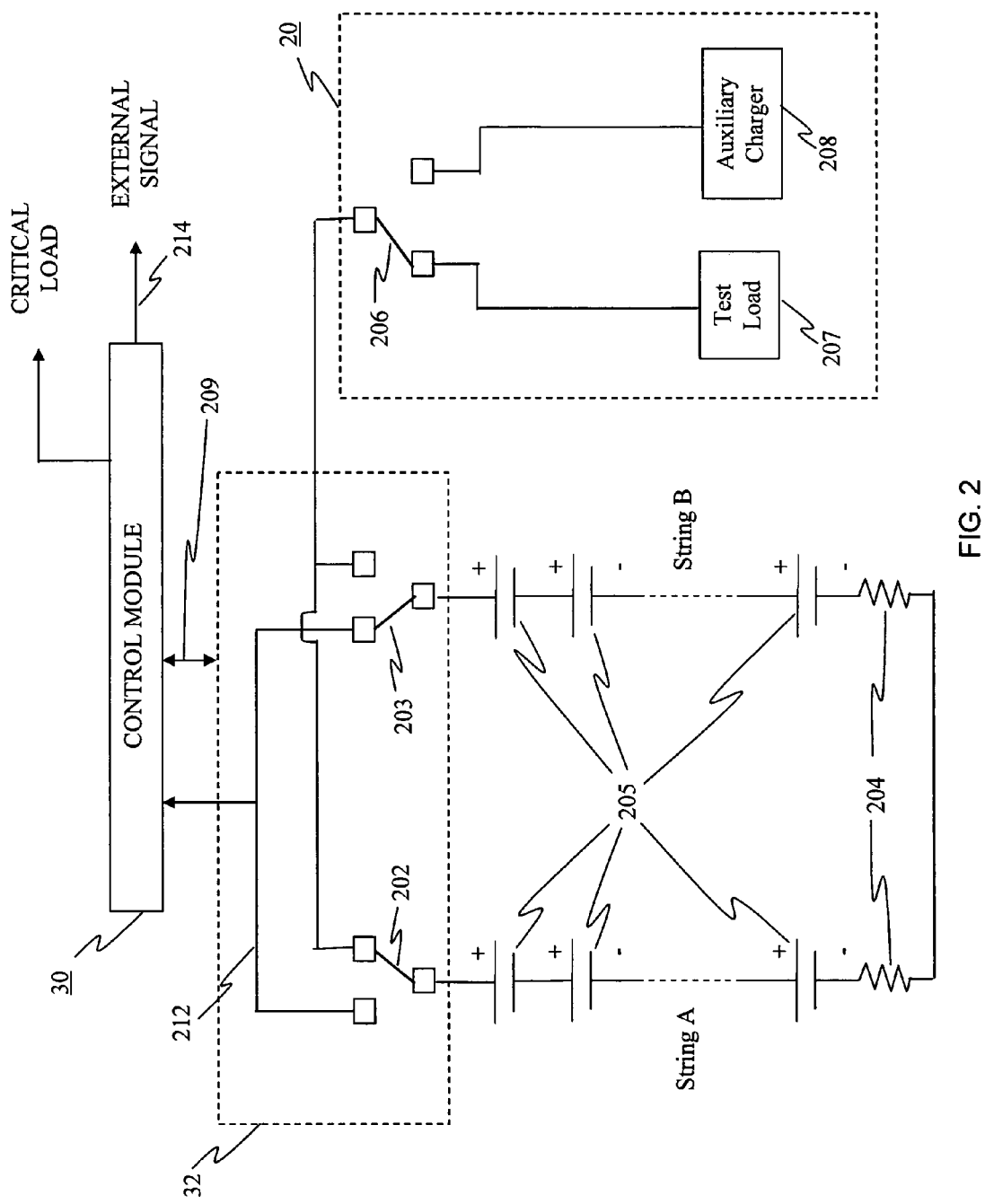
FIG. 2 is a block diagram of one embodiment of the system according to the present invention incorporating two battery power supply strings.

In one embodiment of the standby power supply system of the present invention, an uninterruptible power supply (UPS) with at least two strings of batteries is utilized, as depicted in FIG. 2. A two-way switch (switch 202 for String A and switch 203 for String B in FIG. 2) and a shunt 204 are added to each string of battery elements 205. The shunts are for the measurement of the currents in each string. The other poles of each switch are connected to the common of another switch (switch 206 in FIG. 2) with the output poles of this switch connected alternatively to a Test Load 207 and an Auxiliary Charger 208. The switches are remotely operable within the control module 30 and could be electromechanical relays or the equivalent, such as semiconductor devices that can perform the switching functions.

During normal operation, each of the switches 202 and 203 are positioned so as to connect the corresponding battery string to the main direct current (DC) buss 212, as shown for switch 203 in the figure. String B therefore can be float charged, such as be a rectifier within the control module, as is the standard practice in such equipment. With a pre-determined frequency, the switches 202, 203 and 206 will be reconfigured by the control module so that one of the strings is connected to the Test Load 207 and after a period of time, to the Auxiliary Charger 208. In FIG. 2, switch 202 and 206 are configured so as to connect String A to the Test Load 207. Each of the strings will be disconnected from the main DC buss and connected to the Test Load and then to the Auxiliary Charger is a pre-determine sequence, controlled by the control module through a control means 209 to the switching means 32. The time interval between switching events should be such that there is always adequate power and energy available from the remaining strings to supply the loads to the critical load in the event of a power failure. The sequence of operation of the switches is controlled by the control module which will generally have an embedded processor that allows measurement, recording and output of the voltage and current of each string and of the shunts in each string.

When one of the strings is connected to the Test Load 207, that string is discharged. The voltage and current in each string are recorded to determine the reliability of the batteries in the string and of the interconnections between the batteries and between the strings and the main DC busses. After the discharge, the string that has been discharged can be recharged with the Auxiliary Charger until measurement of voltage and current indicate that the string can be returned to service. If, during the test, it is determined by the control module software that the string is not likely to perform as required during a power failure, then a signal 214 can be sent to an external maintenance facility, human agency, or other facility to alert personnel that a repair is required. This system thus does not require maintenance until automatic testing determines that maintenance is needed, allowing more efficient use of personnel. Additionally, the control module can provide to maintenance personnel a record of the performance characteristics of the string requiring maintenance so that more efficient problem diagnosis and repair can be made.

Figure 3:
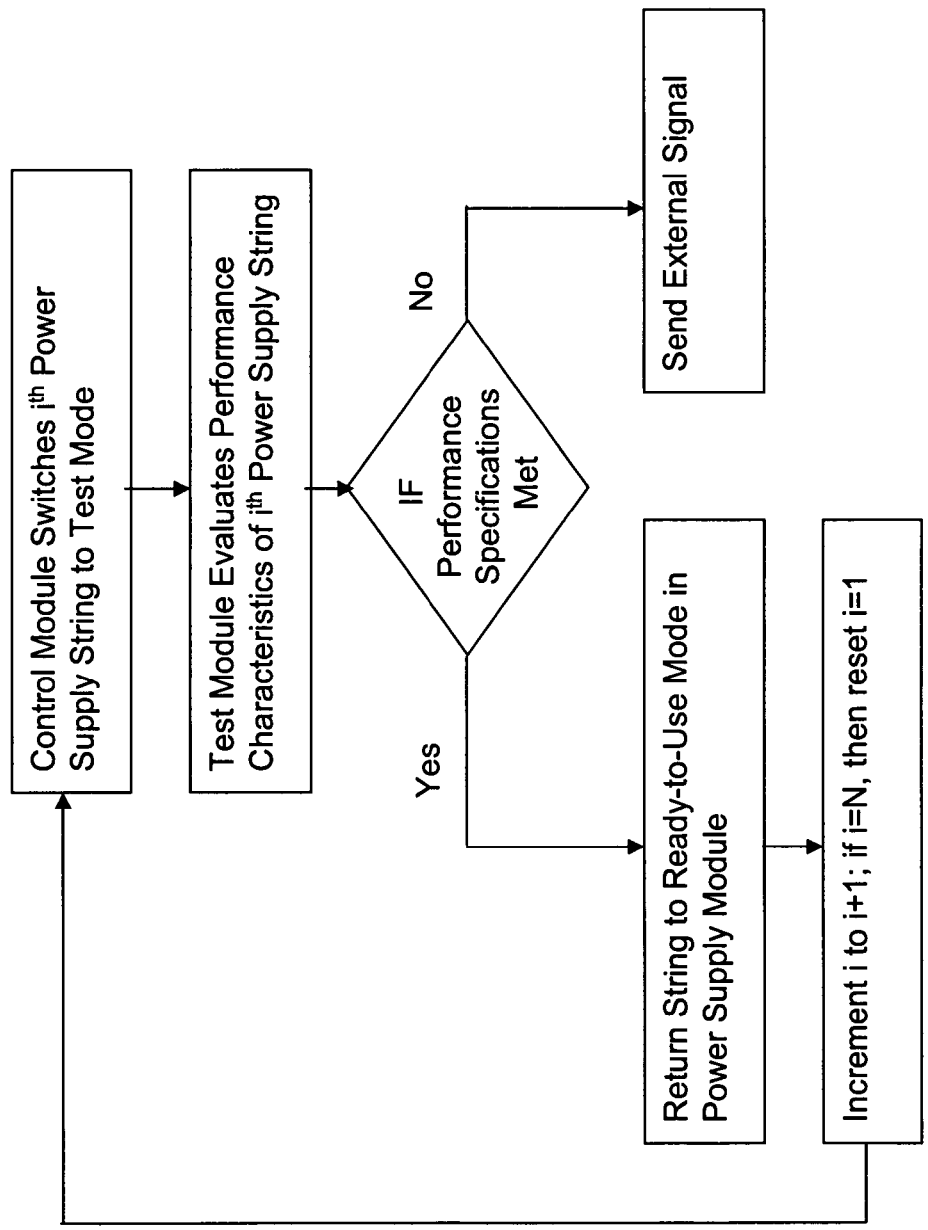
FIG. 3 is a block diagram of the testing protocol of the method of the present invention.

FIG. 3 illustrates the testing protocol in the method of the present invention. Under the control of the control module, the power supply strings are switched individually in a predetermined sequence from a ready-to-be-used mode, or standby mode, into a test mode. The $i^{th}$ power supply string, where i goes from 1 to N, the total number of strings, is switched to the test mode where the test module evaluates the performance of that string. The performance is evaluated according to pre-determined protocol as previously described, and can include discharge tests, capacity tests and performance trend analysis where test results include voltage values, current values, temperature values and impedance values over time. The performance of the entire string can be evaluated as well as the performance of individual elements of the string or some subset thereof. If pre-determined performance specifications are met, the power supply string can be switched back into standby mode, the value of i is incremented to the next string until the final string is tested, at which time the counter i is reset to the first string and the testing process continues, with the control module switching the next power supply string into the test mode. If the performance specifications of the power supply string are not met, then an external signal can be sent to initiate repairs or maintenance of the string. Additionally, the performance of the power supply strings can be evaluated while the strings are also in the ready-to-be-used mode and not in the testing mode. Similarly to the test mode, the voltage, current, impedance and temperature can be measured and used to evaluate the performance characteristics of the power supply strings even though specific performance tests (such as the discharge test) are not performed. These values can be measured at pre-determined intervals while the system is in a stand-by mode and can also be measured if the system is called into providing power in the event of a power failure of the primary power supply. Using performance trend analysis or other analysis to compare the performance characteristics of the power supply strings in the ready-to-be-used mode to pre-determined criteria, the performance can also be evaluated.

In the method of the present invention, the control module controls the testing protocol illustrated in FIG. 3 and as well as providing monitoring of the primary power status and whether the critical load requirements are being met, switching power from the power supply module to the critical loads as necessary to provide sufficient power to the critical load. The control module can also provide float charging of the power supply strings as necessary, control periodic or continuous monitoring of the power supply characteristics of the strings, and control the performance evaluation of the power supply strings and elements thereof.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A power management system, comprising:
   a power supply means comprising a plurality of power supply strings;
   a testing means operably connected to said plurality of power supply strings for evaluating performance characteristics of said plurality of power supply strings, wherein said testing means comprises means for evaluating performance characteristics of the group consisting of an individual power supply string and a power element of said power supply string, said means for evaluating performance characteristics selected from the group consisting of a discharge test means, a capacity test means, and a performance trend analysis means to predict the performance of at least one of the group consisting of said individual power supply string and said power element of said power supply string; and
   a control means for monitoring power requirements and comprising a switching means for controlling switching of said plurality of power supply strings to said testing means, wherein said control means comprises software for comparing said performance characteristics against pre-determined characteristic values to determine if said power supply string meets pre-determined performance requirements.

2. The power management system of claim 1 wherein said power supply strings comprise power elements selected from the group consisting of batteries.

3. The power management system of claim 2 wherein said power supply strings comprise a plurality of batteries and a shunt.

4. The power management system of claim 1 wherein said testing means comprises a test load and an auxiliary charging system.

5. The power management system of claim 1 wherein said control means comprises means for sequentially and periodically switching each power supply string to be tested by said testing means.

6. The power management system of claim 1 wherein said control means comprises means for float charging of said plurality of power supply strings.

7. The power management system of claim 1 wherein said control means comprises means for transmitting an external signal to a human agency in the event of failure of a power supply string to meet said pre-determined performance requirements.

8. The power management system of claim 1 comprising means for measuring performance characteristics of said plurality of power supply strings, said performance characteristics selected from the group consisting of voltage, current, resistance and temperature.

9. A method for evaluating the readiness of elements of a standby power system, where the system comprises
   a power supply means comprising N power supply strings, where $N \geq 2$;
   a testing means operably connected to said plurality of power supply strings for evaluating performance characteristics of said plurality of power supply strings; and
   a control means for monitoring power requirements from a critical load and comprising a switching means for controlling switching of said plurality of power supply strings to said testing means;
   the method comprising:
   switching to the testing means in sequence each power supply string i in the power supply means, said testing means performing a performance trend analysis to predict the performance of at least one power supply string i; and at least one test selected from a discharge test and a capacity test to produce test results that allow evaluation the performance of said power supply string i;
   comparing the test results against pre-determined performance criteria to achieve an outcome selected from performance criteria met and performance criteria not met; and
   transmitting a signal to an external agency if said outcome is performance criteria not met and switching said power supply string i to said power supply means if said outcome is performance criteria met.

10. The method of claim 9 wherein said test results are selected from voltage values, current values, impedance values, and temperature values.

11. The method of claim 9 wherein said power supply strings not switched to said testing means are float charged.

12. The method of claim 9 wherein said control means switches power from said power supply means to said critical load if said power requirements are not met.

13. The method of claim 9 wherein performance characteristics of the plurality of power supply strings are measured, said performance characteristics selected from the group consisting of voltage, current, temperature, and impedance.

* * * * *